United States Patent
Turullols et al.

(10) Patent No.: US 9,772,375 B2
(45) Date of Patent: Sep. 26, 2017

(54) HIGH SENSITIVITY DIGITAL VOLTAGE DROOP MONITOR FOR INTEGRATED CIRCUITS

(71) Applicant: Oracle International Corporation, Redwood City, CA (US)

(72) Inventors: Sebastian Turullols, Los Altos, CA (US); Vijay Srinivasan, Menlo Park, CA (US); Changku Hwang, Morgan Hill, CA (US)

(73) Assignee: Oracle International Corporation, Redwood City, CA (US)

( * ) Notice: Subject to any disclaimer, the term of this patent is extended or adjusted under 35 U.S.C. 154(b) by 336 days.

(21) Appl. No.: 14/691,332

(22) Filed: Apr. 20, 2015

(65) Prior Publication Data

US 2016/0033576 A1 Feb. 4, 2016

Related U.S. Application Data

(60) Provisional application No. 62/032,296, filed on Aug. 1, 2014.

(51) Int. Cl.
| | | |
|---|---|---|
| *G01R 31/317* | (2006.01) | |
| *G06F 1/32* | (2006.01) | |
| *H03K 3/037* | (2006.01) | |
| *H03K 5/159* | (2006.01) | |
| *G01R 31/30* | (2006.01) | |
| *H03K 5/133* | (2014.01) | |

(52) U.S. Cl.
CPC ... *G01R 31/31725* (2013.01); *G01R 31/3004* (2013.01); *G06F 1/3206* (2013.01); *G06F 1/3296* (2013.01); *H03K 3/037* (2013.01); *H03K 5/159* (2013.01); *H03K 5/133* (2013.01)

(58) Field of Classification Search
CPC .............. G01R 31/31725; G01R 19/25; G01R 31/3004; H03K 5/159; H03K 3/037; H03K 5/133; G06F 1/3296; G06F 1/3206
USPC ....................................................... 324/762.03
See application file for complete search history.

(56) References Cited

U.S. PATENT DOCUMENTS

2006/0186936 A1* 8/2006 Cao ...................... H03L 7/0818
327/158
2014/0354264 A1* 12/2014 Turullols ........... G01R 19/2503
324/113

* cited by examiner

*Primary Examiner* — Melissa Koval
*Assistant Examiner* — Courtney McDonnough
(74) *Attorney, Agent, or Firm* — Polsinelli PC (57) ABSTRACT

Implementations of the present disclosure involve a system and/or method for measuring on-die voltage levels of an integrated circuit through a digital sampling circuit. In particular, the system and/or method utilize a delay line based analog-to-digital sampling circuit that produces a voltage reading over time, such as at every high frequency clock cycle. In one embodiment, the digital sampling circuit or digital voltage monitor circuit includes a coarse delay component or circuit that further delays the propagation of a clock signal through the delay line. The coarse delay circuit may be programmed to delay the propagation of the signal through the delay line in such a manner as to allow for multiple edges of a clock or test signal to travel simultaneously down the delay line and increase the sensitivity of the circuit. Additional sensitivity of the digital voltage monitor circuit may also be obtained through selection of the types of components that comprise the circuit and a clock jitter monitor circuit configured with a constant supply voltage.

19 Claims, 6 Drawing Sheets

HIGH SENSITIVITY DIGITAL VOLTAGE DROOP MONITOR FOR INTEGRATED CIRCUITS

CROSS-REFERENCE TO RELATED APPLICATIONS

This application claims priority under 35 U.S.C. §119(e) to U.S. Provisional Application No. 62/032,296 entitled "HIGH SENSITIVITY DIGITAL VOLTAGE DROOP MONITOR FOR INTEGRATED CIRCUITS", filed on Aug. 1, 2014 which is incorporated by reference in its entirety herein.

FIELD OF THE DISCLOSURE

Aspects of the present invention relate to computing systems and, more particularly, aspects of the present invention involve monitoring and regulating voltages within an integrated circuit through a digital voltage monitor circuit.

BACKGROUND

Computers are ubiquitous in today's society. They come in all different varieties and can be found in places such as automobiles, laptops or home personal computers, banks, personal digital assistants, cell phones, as well as many businesses. In addition, as computers become more commonplace and software becomes more complex, there is a need for the computing devices to perform faster and more reliably in smaller and smaller packages.

As the design of computing systems continues to increase in complexity, certain tradeoffs are generally considered by a designer. For example, during design of an integrated circuit, such as a multi-core processor, analysis of the operation of the integrated circuit may be monitored and tested to improve the performance of the circuit. In particular, monitoring of a voltage in an integrated circuit allows for optimization of the power consumed by the circuit. Minimizing the voltage for a given operating frequency reduces the circuit operating power consumption. Lower power consumption for an integrated circuit design may be desirable over higher power consuming circuits. In addition, various levels of voltage noise may be present in an operating circuit or chip that can degrade the performance of the chip. Such so-called voltage droop may occur during heavy loading conditions. In this case, the amount of current demanded by the processor exceeds that which can be provided by the power supply and, as result, the power supply voltage at the transistor level droops. Thus, the ability to monitor and account for operational voltage noise, in addition to monitoring the power consumption of a design, aids in designing a better performing circuit.

Past circuit designs that allow for on-die voltage level measurement of the circuit typically employed one or more analog sensing pins that connect to a voltage meter. However, because these pins are typically located at the outer edge of the integrated circuit, the sensing pins do not accurately reflect the high frequency components of the circuit as the voltage signal is filtered before reaching the sensing pins. Thus, voltage measurement and performance analysis of an integrated circuit may become inaccurate at a high operating frequency. Further, as the operating frequency of integrated circuits increase, the performance monitoring of the circuits becomes less accurate. It is with these and other issues in mind that various aspects of the present disclosure were developed.

SUMMARY

One implementation of the present disclosure may take the form of a digital voltage monitor circuit of an integrated circuit comprising a voltage monitor portion and a coarse delay component. The voltage monitor portion comprises a delay chain comprising a plurality of inverters powered by a supply voltage of the integrated circuit, wherein a speed of propagation of a signal through each of the plurality of inverters is dependent at least on the supply voltage of the integrated circuit and a plurality of flip-flops each connected to a corresponding inverter in the delay chain, the plurality of flip-flops configured to sample the delay chain on a positive edge of a sample clock signal. The delay chain is configured to propagate a system clock signal for the integrated circuit through the plurality of inverters and the plurality of flip-flops is configured to output an N-bit output value corresponding to a power supply voltage measurement of the integrated circuit. Further, the coarse delay component is in electrical communication with the delay chain and is configured to delay the propagation of the system clock signal through the delay chain for at least two cycles of the system clock signal such that a plurality of system clock signal edges are present in the digital voltage monitor circuit at the same time and only one of the at least two cycles of the system clock signal is sampled on the positive edge of the sample clock signal. In one implementation, the integrated circuit is at least one microprocessor that is a portion of a computing system that also includes at least one memory device and the digital voltage monitor circuit in communication with the at least one microprocessor.

Yet another implementation of the present disclosure may take the form of a method for measuring an on-die voltage level in an integrated circuit. The method may include the operations of providing at least two cycles of a system clock signal to a digital voltage monitor circuit comprising a plurality of inverters powered by a supply voltage of the integrated circuit, wherein a speed of propagation of a signal through each of the plurality of inverters is dependent at least on the supply voltage of the integrated circuit, programming a coarse delay component of the digital voltage monitor circuit, the coarse delay component configured to delay propagation of a system clock signal through a delay chain of the digital voltage monitor circuit, the delay comprising at least two cycles of the system clock signal such that a plurality of system clock signal edges are present in the digital voltage monitor circuit at the same time, and latching an output from the plurality of inverters at a plurality of flip-flops each connected to a corresponding inverter in the delay chain, the plurality of flip-flops configured to sample the delay chain on a positive edge of a sample clock signal and output an N-bit output value corresponding to a power supply voltage measurement of the integrated circuit. Through this method, only one of the at least two cycles of the system clock signal present in the digital voltage monitor circuit is sampled on the positive edge of the sample clock signal.

DETAILED DESCRIPTION

Accurate and real-time on-chip supply voltage noise measurements (the across-die variation of peak-to-peak noise, its dependence on application workloads and electrical operating points, voltage transient droop and overshoot waveforms) are key to characterizing the on-chip power distribution network and optimizing its design. Such on-chip real-time voltage noise measurements can also be used by the processor in a feedback control loop to adaptively correct its voltage and/or frequency in response to changing workloads.

As such, implementations of the present disclosure involve a system and/or method for measuring on-die voltage levels of an integrated circuit through a digital sampling circuit. In particular, the system and/or method utilize a delay line based analog-to-digital sampling circuit that produces a voltage reading over time, such as at every high frequency clock cycle. The digitized samples are routed to either an on-die memory structure for later analysis or are transmitted to one or more pins of a chip for capture and analysis by an external analyzer.

In one embodiment, the digital sampling circuit or digital voltage monitor circuit utilizes a coarse delay component or circuit that further delays the propagation of a clock signal through the delay line. The coarse delay component or circuit is programmable for a fine-tuning of the digital voltage monitor circuit. In particular, the coarse delay circuit is configured to delay the propagation of the signal through the delay line in such a manner as to allow for multiple edges of a clock or test signal to travel simultaneously down the delay line. The multiple edges propagating down the delay line may be sampled at a particular period, such as at every clock cycle, and a voltage reading of a circuit may be obtained from the sampled edges. Through the delay of the propagated signal, the signal may spend more time propagating along the delay line such that the effects of the voltage level of the circuit on the propagation is increased. In this manner, the sensitivity of the digital voltage monitor circuit is increased while maintaining the sampling rate of the digital voltage monitor circuit at each clock cycle.

Additional sensitivity of the digital voltage monitor circuit may be obtained through selection of the types of components that comprise the circuit. For example, through a combination of high voltage sensitive delay components utilized in the delay portion of the circuit and high speed capture components utilized in the capturing portion of the circuit, the sensitivity of the digital voltage monitor circuit may be increased. Further, the integrated circuit may include an additional clock jitter monitor circuit configured with a constant supply voltage. This clock jitter monitor is configured to measure the clock jitter that is experienced by the digital voltage monitor circuit and, when compared to measured voltage captured by the circuit, may be used to calibrate or otherwise correct the readings provided by the digital voltage monitor circuit.

One way to measure on-chip real-time voltage is through a digital voltage monitor circuit disclosed herein. In general, the digital voltage monitor circuit is a time-to-digital (TDC) circuit supplied by the on-chip voltage that senses and codes how far a clock edge propagates down a delay line every sampling-clock cycle. Through this circuit, a code corresponding to on-chip voltage taken every clock cycle may be generated and utilized by the circuit as a measurement of the on-chip voltage. However, some inaccuracies to such a digital voltage monitor circuit may occur as voltage sensitivity degrades significantly at high sampling-clock frequencies, reducing the overall sensitivity of the digital voltage monitor circuit. In addition, high frequency supply noise may be present on the measured on-chip transient voltage waveform making spectral analysis of frequency components difficult. Embodiments of a digital voltage monitor circuit for a microelectronic circuit (such as a microprocessor circuit) addresses one or more of the inaccuracies in the voltage monitoring circuit that may occur at high sampling-clock frequencies.

Figure 1:
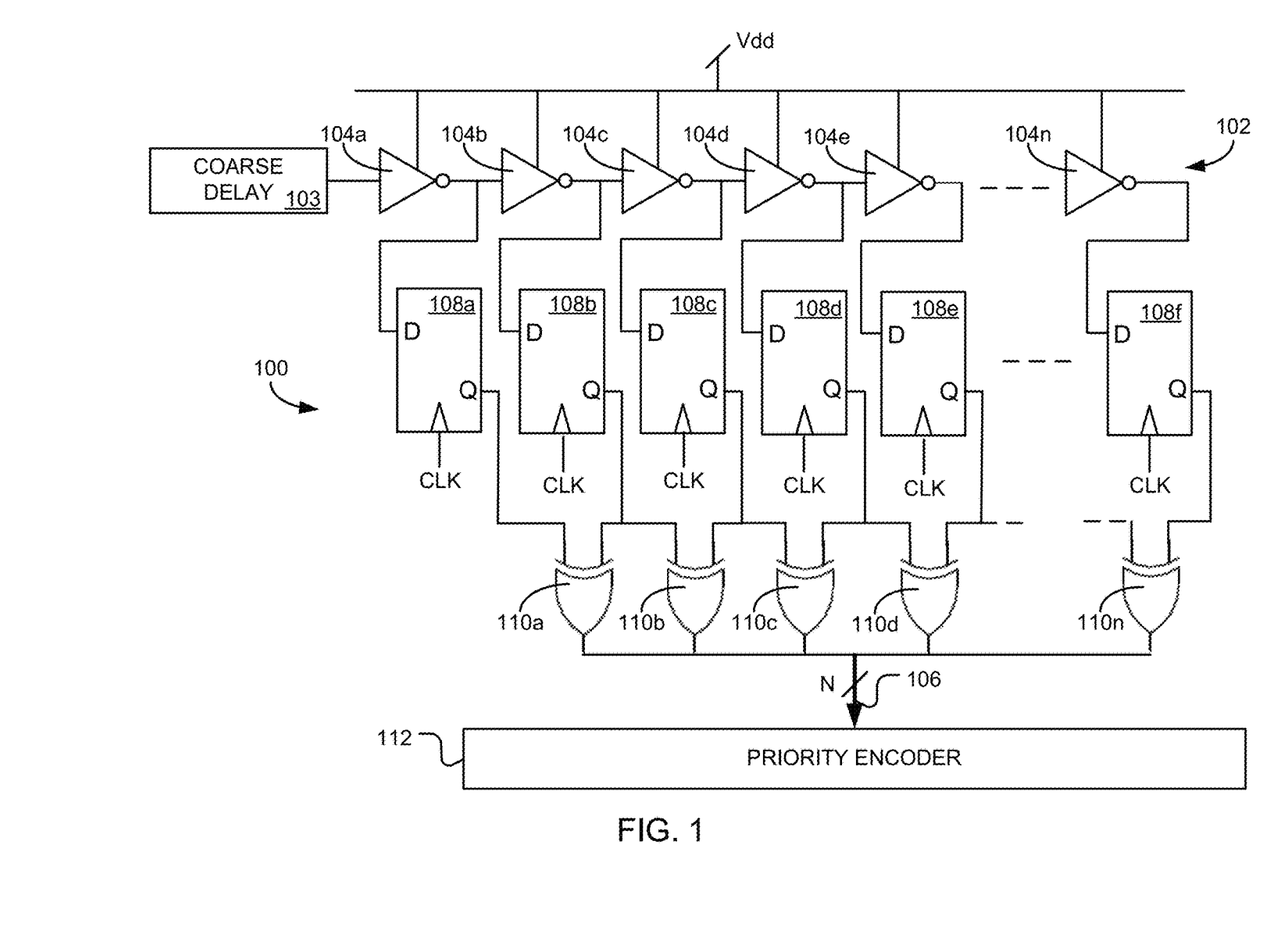
FIG. 1 is a schematic illustration of an embodiment of a digital voltage monitor circuit incorporating a coarse delay device or circuit.

In particular, a high sensitivity digital voltage monitor and measurement circuit for an integrated circuit is shown in FIG. 1 and is generally identified by reference numeral 100. The voltage monitor 100 is operable to sample the power supply voltage of an integrated circuit during a cycle of the system clock. In general, the voltage monitor 100 produces an N-bit voltage measurement signal 106 that indicates a power supply voltage measurement. As used herein, an "N-bit" signal is a digital signal containing a certain number of bits. The number of bits included in the voltage measurement signal 106 may vary depending on the application. Generally, the greater the number of bits used in the voltage measurement signal 106, the more precise the power supply voltage measurement will be. However, the number of bits used in the voltage measurement signal 106 may be limited by power consumption and/or space availability constraints of the microelectronic circuit.

In the embodiment shown in FIG. 1, the voltage monitor 100 includes a delay chain 102 that includes a single rail of interconnected inverters 104a-n. Like other components in the integrated circuit, each inverter 104a-n of the delay chain 102 is powered by the integrated circuit's power supply. The delay that a signal or wavefront experiences when propagating through each inverter 104a-n of the delay chain 102 may depend on fluctuations in the power supply voltage. Each inverter 104a-n may include a circuit element such as a pull-up and/or a pull-down transistor (not shown). These transistors have a switching time that is affected by variations in the power supply voltage. Thus, a higher power supply voltage will result in a faster switching time for the transistor and the corresponding inverter. Conversely, a lower power supply voltage will result in a slower switching time. Hence, the delay through an inverter 104a-n of the delay chain 102 will be less in a higher power supply voltage situation than the delay in a respectively lower power supply situation.

With this in mind, the delay chain 102 may be used to determine the power supply voltage of an integrated circuit by measuring the progress of a wavefront through the chain 102. Measuring the progress of the wavefront through a delay chain 102 may be accomplished by a number of flip-flops 108a-n. Each inverter 104a-n in the delay chain 102 includes an output that is connected to an input of a corresponding flip-flop 108a-n. The flip-flops 108a-n are each clocked by a signal that causes them to sample their inputs at a specific time. The digital voltage monitor circuit 100 may be calibrated so that the flip-flops 108a-n sample their inputs at a point in time in which the wavefront has partially propagated down the delay chain 102. More particularly, the wavefront may be initiated in the delay chain 102 at a first time instance and sampled by the flip-flops 108a-n at a second time instance that is later than the first time instance. As explained in more detail below, in sampling the delay chain 102, a power supply voltage measurement is stored by the flip-flops 108a-n. In particular, each flip-flop 108a-n holds one bit and together the ordered sequence of bits provides, in digital form, the power supply voltage measurement of the microelectronic circuit utilizing the digital voltage measurement circuit.

In one embodiment, the outputs of the flip-flops 108a-n provide a multiple-bit string that indicates how far through the delay chain 102 a waveform has traveled. Such a multiple-bit string is shown as bit string 202 in FIG. 2. In the example shown, a one or high bit value indicates that the waveform has passed through the inverter 104a-n associated with bit position and a zero or low bit value indicates that the waveform has not passed through the inverter 104a-n associated with bit position. Thus, the bit position in the string 202 in which the values of the bits transition from one to zero indicates the point in the delay chain 102 that the waveform has transmitted. As can be appreciated, this position may vary based on the voltage level of Vdd supplied to the inverters 104a-n of the delay chain 102. In another embodiment of the voltage monitor circuit, the values of the output string 202 may include a series of zero or low values followed by series of one or high values, with the crossover position from a low value to a high value indicating the position the waveform was propagated. The analysis and processing of the output string 202 to calculate a relative voltage value for Vdd is described in more detail below.

In general, each bit corresponds to a stage in the delay chain 102. The value of each bit represents whether or not the wavefront reached the corresponding stage in the delay chain 102 when the delay chain was sampled. For purposes of illustration, assume that a value of one indicates that the wavefront reached the corresponding stage, and a value of zero indicates that the wavefront did not reach the corresponding stage. Accordingly, the power supply voltage measurement will be a series of ones at the most significant end and series of zeros at the least significant end. The most significant zero in the power supply voltage measurement will therefore correspond to the location of the wavefront in the delay chain 102 when the delay chain was sampled. The closer the most significant zero is to the least significant end of the power supply voltage measurement, the further the wavefront traveled down the delay chain 102. The greater the power supply voltage, the further down the delay chain 102 the wavefront will travel, and vice-verse. Accordingly, the greater the most significant zero of the power supply measurement, the lesser is the power supply voltage Vdd provided to the delay chain.

In addition, the voltage monitor 100 includes a coarse delay device or series of components 103 that are configured to provide a coarse delay to a waveform transmitted through the delay chain 102. As shown, the coarse delay device 103 is electrically connected to the input of the delay chain 102 of the voltage monitor circuit 100. In general, the coarse delay device 103 is configured to delay a waveform transmitted through the coarse delay device. Further, the coarse delay device 103 may be configurable or programmable to adjust the length of the delay applied to any waveform transmitted through the device. When connected to the delay chain 102 of the voltage monitor circuit 100, the coarse delay device 103 allows for fine tuning of the dynamic range of the voltage monitor circuit. In general, the coarse delay device 103 may delay the input waveform to prevent the waveform from transmitting through the entire delay chain prior to being captured by the corresponding flip-flops 108a-n. This may ensure that the waveform is within the delay chain 102 when the latching mechanism of the flip-flops 108a-n is triggered. Further, as explained in more detail below, additional tuning of the delay caused by the coarse delay device 103 may cause the dynamic range of the output value provided by the circuit to become finer, allowing for a more accurate measurement of the voltage change of the circuit. In one embodiment, the coarse delay 103 may allow for more than one clock edge to travel down the delay chain 102 at any one time while maintaining the sample rate of the circuit, thereby increasing the sensitivity of the digital voltage monitor circuit 100.

Returning to the voltage monitor circuit 100 of FIG. 1, the output of each of the flip-flops devices 108a-n is connected to a corresponding logic gate 110a-n. In one specific embodiment, the logic gates 110a-n may be a series of two-input XOR logic gates. The logic gates 110a-n are arranged such that the output of one flip-flop device connects to a first input to the logic gate and the output of the next flip-flop device connects to a second input to the logic gate. In this manner, each logic gate 110a-n compares a bit of the output signal from the circuit to the next bit in the output signal. The logic gates 110a-n of the circuit 100 thus operate to determine the location of the crossover in the bits stored in the flip-flops devices 108a-n from high to low or from low to high to indicate the propagation of the waveform through the delay chain. The output of the logic gates 110a-n is combined into a n-bit string as the digital voltage monitor circuit output 106.

Figure 2:
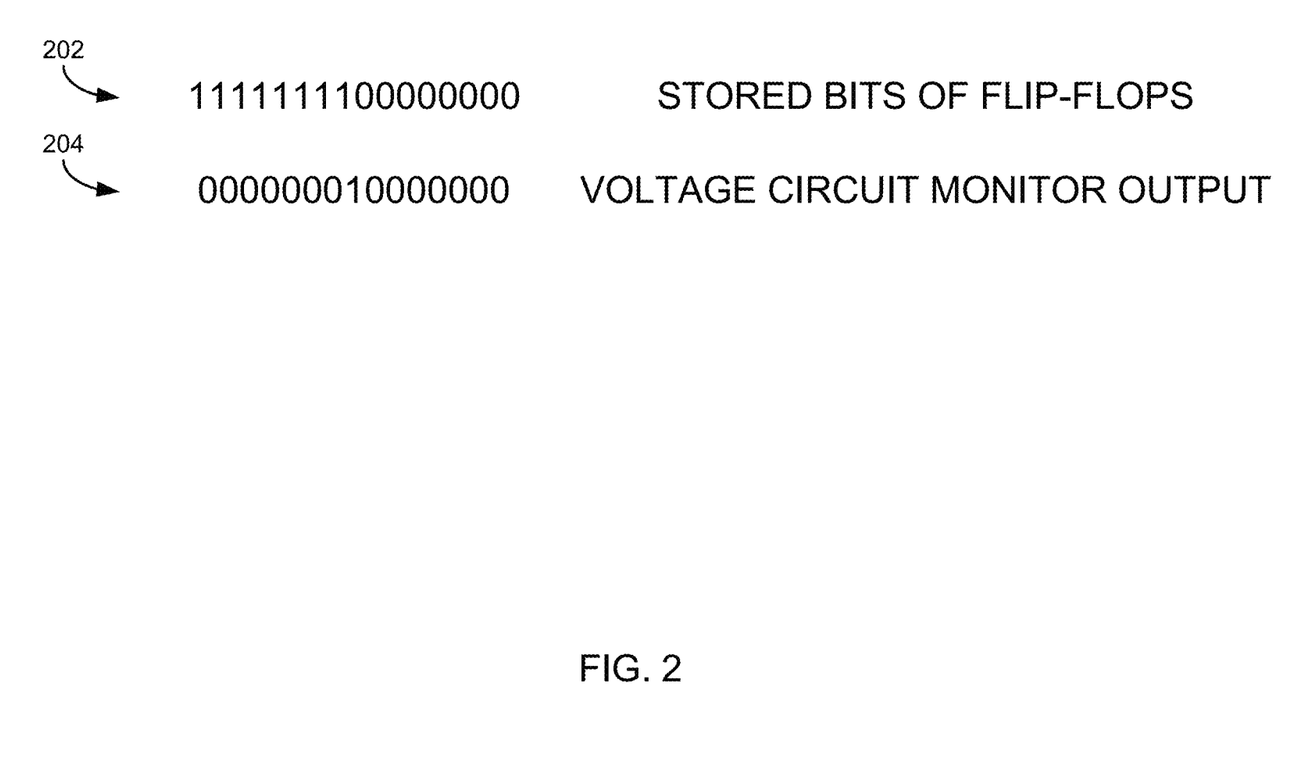
FIG. 2 is an illustration of digital signals associated with a digital voltage monitor circuit.

FIG. 2 includes an example of the voltage monitor circuit output string 106. In particular, the output string 106 illustrated in FIG. 2 corresponds to the multi-bit string 204 of bits stored in the flip-flop devices of the voltage monitor circuit. As shown, the output string 204 indicates with a bit value one or high at the location of the crossover between bit values one and bit value zero in the multi-bit string 202. This is accomplished through the logic gates 110a-n of the circuit 100 that compares a bit of the multi-bit string 202 with the next bit in the string. Where the bits change from high to low or low to high, the output string 204 includes a one or high value. This high value thus corresponds to a relative voltage measurement for the voltage monitor circuit 100 and can be analyzed to determine a voltage level for the circuit under various loads and environments. For example, the closer the high value in the output string 204 is to the most significant end of the string, the slower the waveform propagated through the delay chain 102 due to a lower voltage Vdd being provided to the inverters 104a-n of the circuit 100. Conversely, the closer the high value in the output string 204 is to the least significant end of the string, the faster the waveform propagated through the delay chain 102 due to a higher voltage Vdd is being provided to the inverters 104a-n of the circuit 100. It should be appreciated that the output sting 106,204 may include a series of one or high values with a low or zero value indicating the propagation of the waveform through the delay chain 102.

With a generated output string 106, a circuit or device utilizing the voltage monitoring circuit 100 may analyze the operating voltage of the circuit or device for various reasons. For example, the information may be utilized to monitor the performance of the circuit through various loads and operating conditions. In addition, various operations may be performed on the output string 106 to aid in the analysis of the measurements. In one example, the output string 106 is transmitted to a priority encoder 112 of the integrated circuit. The priority encoder 112 may be configured to address the situation where the output string 106 includes more than one asserted bit in the output. More than one asserted bit in the output string 106 may occur for many reasons, such as a mistakenly flipped bit due to electromagnetic radiation, metastability of the flip-flop device (when a clock transition occurs inside the setup/hold violation window of a flip-flop device around the bit position where the transition occurs), and the like. In such as case, the priority encoder 112 is configured to ensure that only one bit in the output string 106 is set. For example, the priority encoder 112 may retain the lowest asserted bit and set the other asserted bits back to a zero or low value. However, the priority encoder 112 may be configured to retain any of the asserted bits as desired. In another embodiment, the output string 106 may be provided to a watermarking module of the circuit 100. The watermarking module may be configured, in one embodiment, to determine the highest and/or lowest readings from the voltage monitoring circuit 100. In one example, the watermarking module includes a bit-wise logical OR component that logically ORs each of the received output strings 106 from the voltage monitoring circuit 100 with the current state of the measurement circuit, at each cycle. The output of the logic component provides a bit string indicating the highest voltage and lowest voltage reading received by the watermarking module from the voltage monitoring circuit 100. Regardless of the implementations of the voltage monitor utilized by the integrated circuit, the output string 106 may be obtained and analyzed to determine the performance of the circuit.

Figure 3:
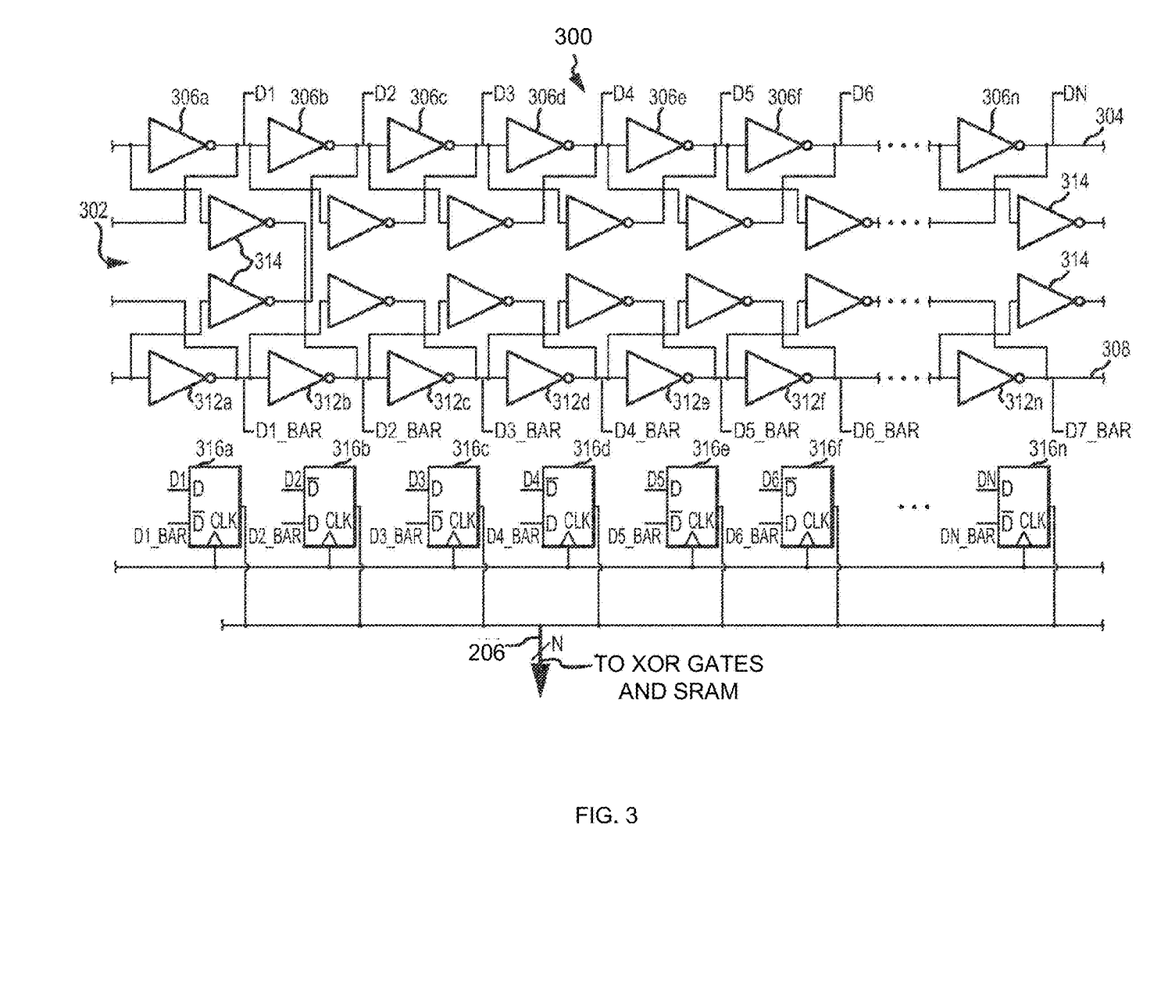
FIG. 3 is a schematic illustration of a second embodiment of a digital voltage monitor circuit.

FIG. 3 is another embodiment of a digital voltage monitor that may be utilized in one or more of the embodiments of the present disclosure. The voltage monitor 300 embodiment shown in FIG. 3 includes a delay chain 302 that includes two delay chains rails interconnected by means of cross-coupled inverters. The first delay chain rail 304 includes a series of interconnected rail inverters 306a-n. The second delay chain rail 308 includes a series of interconnect rail inverters 312a-n. The delay chain 302 additionally includes a number of cross-couple inverters 314 that interconnect the first delay chain rail 304 with the second delay chain rail 308. A particular cross-couple inverter 314 connects a rail inverter in the first delay chain rail 304 to a rail inverter in the second delay chain rail 308, or connects a rail inverter in the second delay chain rail 308 to a rail inverter in first delay chain rail 304. The cross-couple inverters 314 have a "feed-forward" characteristic. As used herein "feed-forward" refers to a circuit path or element that connects a first circuit node to a second circuit node, the second node being ahead of or "downstream" from the first node with respect to the flow of information in the circuit. With respect to the delay chains, a feed-forward element or path may advance information down the chain a certain number of stages and in so doing bypass intermediate stages.

In the delay chain 302 shown in FIG. 3, each cross-couple inverter 314 feeds forward two stages in the delay chain 302. A cross-couple inverter 314 feeds a signal from the initial input on the first delay chain rail 304 forward past the second rail inverter 306b to the input of the third rail inverter 306c of the second delay chain rail 308. Similarly, a cross-couple inverter 314 feeds a signal from the initial input on the second delay chain rail 308 forward past the second rail inverter 312b to the input of third rail inverter 312c of first delay chain rail 304. This feed-forward-two characteristic is repeated for subsequent stages of the delay chain 302. In general, however, operation of the digital voltage monitor circuit 300 of FIG. 3 is similar to that described above with reference to FIGS. 1 and 2 such that the circuit provides a n-bit output string 206 that provides an indication of the propagation of a waveform along the delay chain 302 in relation to a supply voltage provided to the circuit. This output string 206 may be analyzed in a similar manner as described above.

Although illustrated in FIG. 3 as including a feed forward of two stages in the delay chain 302, the circuit 300 may feed forward the signal any number of stages in the delay chain. For example, the feed forward mechanism of the circuit 300 may feed the signal four stages in the delay chain 302. In addition, the circuit 300 may include other features intended to improve the efficiency of the circuit. For example, the circuit 300 may include a smaller set of delay chains and/or feed forward components at the beginning of the delay chain that act to achieve a steady-state delay convergence of the clock signal.

As mentioned, some inaccuracies to a digital voltage monitor circuit such as that described above may occur due to voltage sensitivity degradation at high sampling-clock frequencies. However, the present disclosure provides some embodiments that increase the sensitivity of the digital voltage monitor circuit in an effort to improve the accuracy of the circuit. In one example, and explained in more detail below, the coarse delay 103 component of the circuit 100 can be programmed to delay the propagation of the signal through the delay line 102 in such a manner as to capture multiple leading edges of the clock signal. This operates to increase the sensitivity of the circuit 100 by increasing the clock period of the sampled signal while maintaining the sampling rate of the circuit. In another example also explained below, the sensitivity of the digital voltage monitor circuit 100 may be increased through the use of a combination of high voltage sensitive delay components and high speed capture components. The methods and circuits described herein to increase the sensitivity of the digital voltage monitor circuit may be used separately or in conjunction.

Figure 4:
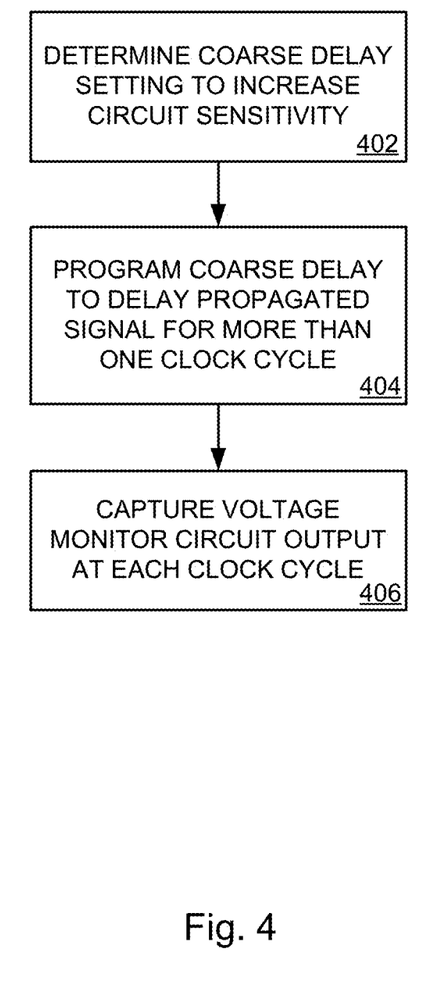
FIG. 4 is a flowchart of a method for increasing the sensitivity of a digital voltage monitor circuit to obtain voltage measurements for an integrated circuit by utilizing a coarse delay device or circuit associated with the digital monitor circuit.

FIG. 4 is a flowchart of a method for increasing the sensitivity of a digital voltage monitor circuit to obtain voltage measurements for an integrated circuit by utilizing a coarse delay device or circuit associated with the digital monitor circuit. The operations of the flowchart of FIG. 4 are discussed in relation to the circuit 100 of FIG. 1, although the digital monitor circuit illustrated in FIG. 3 may also perform the operations of the method. Thus, the operations may be performed by the one or more components of the circuit 100, as well as a computing device or computing circuit that utilizes the digital voltage monitor circuit of FIG. 1. In one particular embodiment, a microprocessor circuit may utilize the method of FIG. 4 to improve the sensitivity of the digital voltage monitor circuits described above.

Beginning in operation 402, the computing device utilizing the digital voltage monitor circuit 100 determines a coarse delay setting for the coarse delay device 103 of the circuit. As mentioned above, the coarse delay device or circuit 103 is programmable to provide different delay times for propagation of the signal through the delay chain 102. In one embodiment, the coarse delay 103 is programmable through a software program executed by the computing device utilizing the digital voltage monitor circuit 100. In another embodiment, the coarse delay 103 is programmable through one or more logic components of the computing device. Regardless of the embodiment used, the computing device selects a coarse delay 103 setting for increasing the sensitivity of the digital voltage monitor circuit 100 and programs the coarse delay in operation 304.

In one embodiment, the setting of the coarse delay 103 is selected to delay the propagation of the clock signal down the delay chain 102 for a period greater than the clock signal period. In other words, the coarse delay 103 may be set to provide a sufficiently large delay to allow two or three back-to-back signal edges to travel simultaneously down the delay line. For example, for digital voltage monitor circuits that utilize a clock signal as the signal transmitted along the delay line 102, the coarse delay 103 may be set to delay the propagation of the clock signal for longer than the clock period (such as a delay between two and three clock periods). Then, by the time the first clock signal edge propagates down the delay chain 102, the wavefront has traveled through the coarse delay device 103 and down the delay chain 102 for more than one full clock cycles before being latched or captured by the circuit 100. In essence, the coarse delay 103 operates to extend the length of the chain of components of the delay chain 102 so that, as the wavefront travels through more delay components before being latched or captured by the circuit 100, the wavefront is affected by the voltage delay for each of the components of the lengthened delay chain.

In one specific example, a first edge of the waveform to be captured may begin its propagation through the coarse delay 103. At a first time instance corresponding to a circuit clock, the flip-flops 108a-n of the digital voltage monitor circuit 100 may be triggered to capture the outputs of the components 104a-n of the delay chain 102. However, the outputs of the components 104a-n of the delay chain 102 would not indicate a position of the first edge of the waveform because the first edge of the waveform is still delayed by the coarse delay 103. Further, the waveform experiences a component delay associated with the circuit voltage as it is delayed by the coarse delay 103, similar to the delay described above associated with the components of the delay chain 102. In addition, a second clock edge of the waveform may begin its propagation through the coarse delay 103. Before the occurrence of another clock edge to latch the edge of the waveform in the delay chain 102, the first edge of the waveform passes through the coarse delay 103 and down the delay chain. At a later second time instance corresponding to the clock signal, the flip-flops 108a-n of the digital voltage monitor circuit 100 are triggered to capture the first edge of the waveform in the delay chain 102 (operation 406 of FIG. 4). However, this first edge of the waveform has been affected by the voltage dependent delay of the circuit components for at least two clock cycles, thereby increasing the sensitivity of the digital voltage monitor circuit 100.

In addition, before the occurrence of another clock edge, the second edge of the waveform passes through the coarse delay 103 and down the delay chain 102. At a still later third time instance corresponding to the clock signal, the flip-flops 108a-n of the digital voltage monitor circuit 100 are triggered to capture the second edge of the waveform in the delay chain 102. Similar to the first edge of the waveform, this second edge of the waveform has also been affected by the voltage dependent delay of the circuit components for two (or more) clock cycles, thereby increasing the sensitivity of the digital voltage monitor circuit 100. However, it should be noted that, although each edge of the waveform passing through the digital voltage monitor circuit 100 is affected by the circuit voltage for two (or more) clock cycles, the sampling rate of the circuit is not reduced. Rather, after an initialization period, the circuit 100 captures a voltage reading at every clock cycle. In other words, only the capturing or reading of the first edge of the waveform is delayed for two clock cycles. After the initialization to allow the first edge to propagate to the delay chain 102, a reading or latching of the transmission of the clock edge along the delay chain 102 of the circuit occurs at every clock cycle. In this manner, the sensitivity of the digital voltage monitor circuit 100 is increased (due to each clock edge being affected by the supplied voltage to the components for a longer period of time than one clock cycle) with no reduction in the sampling rate of the circuit (after the initialization period, as a reading is obtained at each cycle of the sampling clock).

In general, it is not necessary that the coarse delay 103 be programmed so that the edges of the waveform are delayed for two clock cycles. Rather, the coarse delay 103 may be programmed to delay the waveform for any amount of time. A longer coarse delay 103 may result in even more sensitivity by the digital voltage monitor circuit 100. For example, by exposing the waveform edges to the effect of the supplied voltage for a longer time period, the sensitivity of the digital monitor circuit may increase. Regardless of the amount of delay time programmed into the coarse delay 103, after an initialization period, the sampling rate of the digital voltage monitor circuit 100 remains the same from embodiment to embodiment (based, in general, on the clock signal of the circuit). In one particular example, the course delay 103 is programmed to delay the waveform for two or three cycles and in some instances, may be dependent upon the frequency of the clock signal.

Some practical effects of this approach of increasing the sensitivity of the digital voltage monitor circuit 100 may be observed. For example, such an approach will not generally be as sensitive to fast voltage changes occurring in less than one clock cycle of the circuit as the reading obtained from the circuit is an average of the voltage effects within the circuit over multiple clock cycles. Also, since the multi-cycle measurement is an average of the supply voltage of the circuit, one application of this approach is to band-limit (filter out high frequency supply noise) a measured high-resolution step-load voltage transient so that spectral analysis is easily able to detect the dominant lower frequency components and enable power distribution network impedance characterization.

In another embodiment of the digital voltage monitor circuit 100, the sensitivity of the monitor circuit may be increased or further increased through the use of different types of components within the circuit. In particular, and as described in more detail below, the types of components used for the circuit may correspond to one or more stages of the circuit to increase the overall sensitivity of the monitor circuit. Also, the component selection of the digital voltage monitor circuit 100 may be utilized in conjunction with the coarse delay 103 approach described above, or may be used without the coarse delay approach. In either embodiment, the component selection of the digital voltage monitor circuit 100 may improve the sensitivity of the circuit.

The first group of digital voltage monitor circuit 100 components (referred to herein as the first stage) includes the coarse delay components 103 and any other components not involved in the capture of the output of the delay chain components 104a-n. In general, to increase the overall sensitivity of the digital voltage monitor circuit, the components of the first stage may be transistor-type components (or other types of components) that have a high threshold voltage characteristic. In general, transistors with a high threshold voltage have a high gate delay function for a fixed change in supply voltage. In other words, high threshold voltage components cause large changes in the wavefront delay in response to small changes in the supply voltage to the component. Large delay changes in the selected components may result in large delays or shifts as the wavefront propagates through the high threshold voltage components. As such, by utilizing high threshold voltage components in the first stage of the digital voltage monitor circuit 100, small shifts in supply voltage of the circuit may be more sensitively captured through the delay experienced by a wavefront propagating through the components. This increased sensitivity to the changes in the supply voltage may be seen by the digital voltage monitor circuit 100 when the wavefront is captured.

However, while the high threshold voltage components are sensitive to changes in the supply voltage seen by the components of the digital voltage monitor circuit 100, such components may not be generally useful for capturing the propagation of the wavefront through the circuit. Rather, components that may not be as sensitive to a change in the supply voltage but nonetheless allow the wavefront to propagate through the component as a faster rate may provide the circuit with a more finely tuned capture circuit. In particular, the digital voltage monitor circuit 100 may operates more efficiently when the wavefront is allowed to propagate through the delay chain 102 at a fast rate so that the capture of the wavefront position within the chain is more finely tuned. Components that act to slow this progression through the delay chain 102 may be less useful within the delay chain. As such, to increase the effectiveness of the monitor circuit, the delay chain 102 portion of the digital voltage monitor circuit 100 (referred to herein as the second stage of the circuit) may comprise components that are less sensitive to the supply voltage than the first stage components, but transition at a high rate. The second stage components are thus configured to provide a fine tune to the delay chain 102 and capture features of the digital voltage monitor circuit 100.

When used together, the first stage components and the second stage components operate to increase the sensitivity of the digital voltage monitor circuit 100 without negatively affecting the performance of the circuit. In particular, the first stage components increase the sensitivity to the supply voltage provided to the circuit. In one embodiment, the wavefront may spend a majority of the propagation time in the first stage components such that variations in the supply voltage actively effect the wavefront propagation through the first stage. The second stage components then operate to provide a more finely tuned capture of the wavefront propagation without slowing the propagation of the wavefront through the delay chain 102 too much. In one embodiment, the wavefront propagates through the second stage components for only a short time at the end of the overall propagation cycle. In this manner, by selecting the particular components by which the circuit is composed, the overall sensitivity of the digital voltage monitor circuit 100 to the supply voltage may be further increased.

In another embodiment of the present disclosure, a microelectronic or integrated circuit may include a clock jitter monitor circuit configured with a constant supply voltage and paired with an embodiment of the digital voltage monitor circuits discussed above. In general, the clock jitter monitor circuit may be configured to provide an indication of a jitter (or other noise) in a clock signal of an integrated circuit that is experienced by the digital voltage monitor circuit. Such a jitter may provide one or more inaccurate readings of the digital voltage monitor circuit and may thus be utilized to calibrate or otherwise correct the readings provided by the digital voltage monitor circuit. In general, the clock jitter monitor circuit may have the same or a similar construction as the digital voltage monitor circuits 100, 300 described above. As such, the clock jitter circuit is described herein with reference to the circuit 100 of FIG. 1, although a similar clock jitter circuit may be configured similar to the digital voltage monitor circuit 300 of FIG. 3. However, in contrast to the digital voltage monitor circuits described above where each component of the circuit is provided with the supply voltage of the integrated circuit, the reference voltage provided to each component 104a-n of the delay chain 102 in the clock jitter monitor circuit may be a regulated voltage supply that is relatively stable or quiet. The output of the clock jitter monitor circuit may then be utilized by the microelectronic circuit to adjust the output of the digital voltage monitor circuit 100 in response to jitters in the sample clock signal to counter inaccurate results of the digital voltage monitor circuit due to a clock jitter.

As explained above, the circuit 100 of FIG. 1 provides an output indicative of the propagation of a wavefront through the delay chain 102 of the circuit based on a supply voltage provided to one or more of the components of the circuit. In general, the closer the high value in the output string of the circuit is to the most significant end of the string, the slower the waveform propagates through the delay chain 102 due to a lower supply voltage Vdd being provided to the inverters 104a-n of the circuit 100. Conversely, the closer the high value in the output string is to the least significant end of the string, the faster the waveform propagates through the delay chain 102 due to a higher voltage Vdd is being provided to the inverters 104a-n of the circuit 100. However, jitter (or noise) in the clock signal provided to the flip-flop latches 106a-n that determines when the flops capture the delay line 102 output may cause inaccuracy in the output of the circuit. In particular, a clock jitter may cause the flip-flops 106a-n to latch too soon or too late as the wavefront propagates down the delay chain 102 such that the capture of the wavefront does not correspond to the supply voltage (Vdd) provided to the delay components 104a-n. As such, the output of the digital voltage monitor circuit 100 may be inaccurate at any one time due to jitter in the sampling clock.

Figure 5:
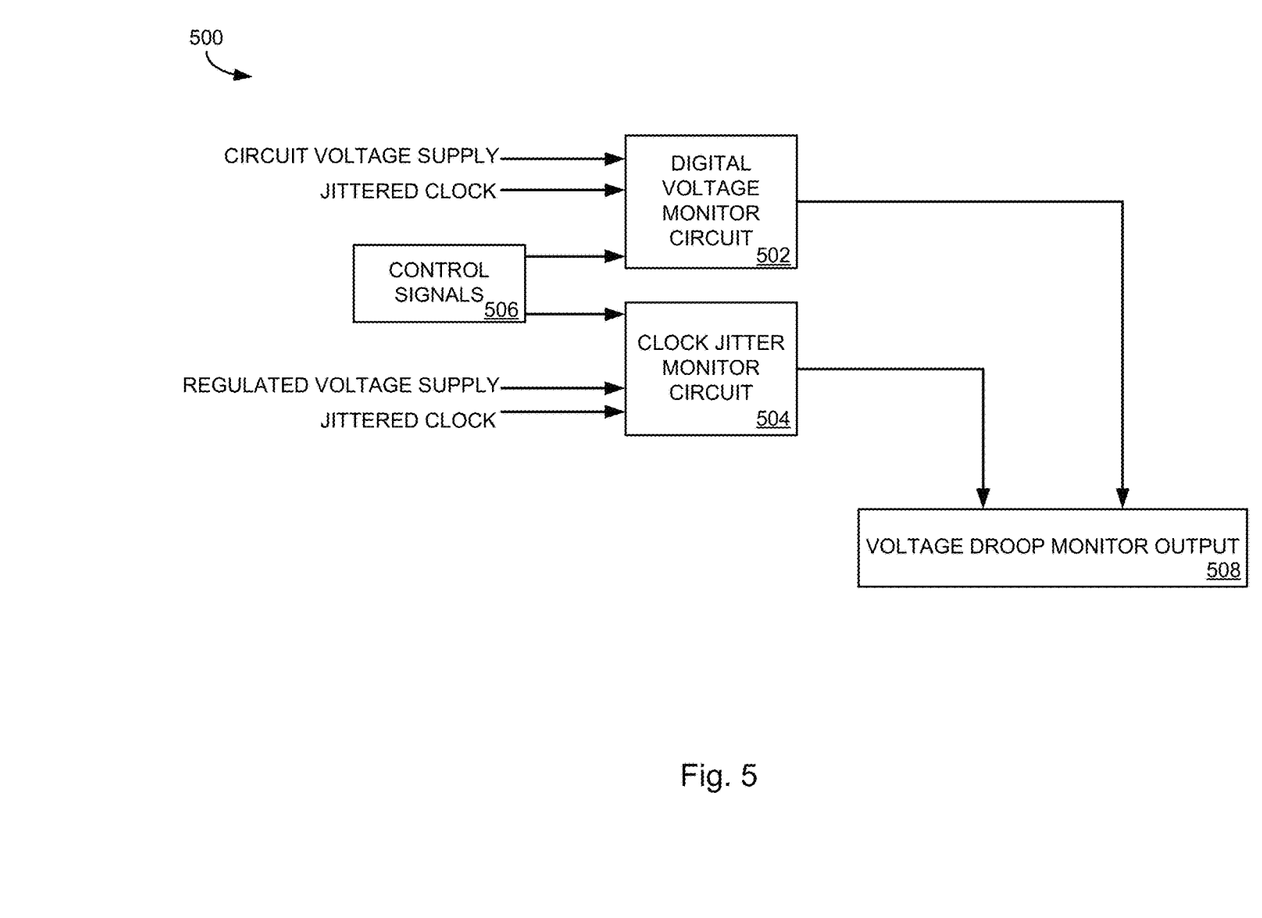
FIG. 5 is a block diagram illustrating a high-level overview of a voltage droop monitor circuit, including a clock jitter measurement and correction portion of the circuit.

To address this inaccuracy, a clock jitter monitor circuit may be incorporated into the integrated circuit and paired with the digital voltage monitor circuit. In general, the clock jitter monitor circuit provides an indication of the clock jitter experienced by the digital voltage monitor circuit 100 such that the integrated circuit may adjust the output of the digital voltage monitor circuit 100 accordingly in response to the monitored clock jitter. FIG. 5 is a block diagram illustrating a high-level overview of an integrated circuit (such as a microprocessor) 500 that includes a voltage droop monitor circuit 502 and a clock jitter measurement and correction circuit 504. Although some elements of the integrated circuit 500 are illustrated in FIG. 5, it should be appreciated that the circuit may include more or fewer components and/or portions of the circuit than shown.

The integrated circuit 500 illustrated in FIG. 5 includes a digital voltage monitor circuit 502. The digital voltage monitor circuit 502 may be the same or a similar circuit as that shown in FIG. 1 and FIG. 3 discussed above. As such, the digital voltage monitor circuit 502 may have as inputs the circuit voltage supply (Vdd in the circuit of FIG. 1) and a clock signal used to cause the flip-flops of the circuit to latch the outputs of the delay chain of the circuit. In one example, the clock signal may include a jitter or noise in the signal that may result in an inaccurate or inadvertent latching of the digital voltage monitor circuit 502. To correct for the jittered clock signal, the integrated circuit 500 may also include a clock jitter monitor circuit 504. As discussed above, the clock jitter monitor circuit 504 and the digital voltage monitor circuit 502 may be similarly constructed. For example, the clock jitter monitor circuit 504 may include a delay chain comprising a number of inverters connected to a number of flip-flop latching devices such that each inverter in the delay chain includes an output that is connected to an input of a corresponding flip-flop.

In one embodiment, the only difference between the digital voltage monitor circuit 502 and the clock jitter monitor circuit 504 is that rather than the circuit voltage supply powering the components of the circuit, the jittered clock monitor circuit 504 includes a regulated voltage supply as an input to the circuit to power the components. This regulated voltage supply is used by the clock jitter monitor circuit 504 as input Vdd to the components of the circuit. In one embodiment, the regulated voltage supply signal is relatively stable compared to the circuit voltage supply signal provided to the digital voltage monitor circuit 502. As should be appreciated from the discussion above, supplying a regulated or stable voltage supply signal to the clock jitter monitor circuit 504 results in the output of the clock jitter monitor circuit being based on the variance in the clock signal rather than a variance in the circuit voltage supply.

Each of the digital voltage monitor circuit 502 and the clock jitter monitor circuit 504 may have one or more control signals 506 as inputs to the circuits. In one example, the control signals may be configured to program the delay component of each of the circuits. In general, any type of control signal 506 utilized by the integrated circuit to control a voltage droop monitor portion of the circuit may be provided to the digital voltage monitor circuit 502 and the clock jitter monitor circuit 504. Also, the output of the digital voltage monitor circuit 502 and the clock jitter monitor circuit 504 may be provided as outputs 508 of the voltage droop monitor portion of the integrated circuit 500. As explained in more detail below, the output of the clock jitter monitor circuit 504 may be used by the integrated circuit to correct or otherwise adjust the output of the digital voltage monitor circuit 502 to remove erroneously results due to jitters in the clock signal.

The output of the digital voltage monitor circuit 502 is used by the integrated circuit as explained above to provide an indication of voltage droop experienced by the integrated circuit at any one time. However, this output may not be accurate due to a jitter in the clock signal that causes the latches of the digital voltage monitor circuit 502 to latch too soon or too late (i.e., not when the rising edge of the clock signal is received at the latch). Thus, a clock jitter may cause the digital voltage monitor circuit 502 to latch the output of the delay chain too soon or too late from a true clock sampling signal. To adjust for this variation in the digital voltage monitor circuit 502 output caused by the jittered clock signal, the output from the clock jitter monitor circuit 504 may be measured and utilized. In particular, because the clock jitter monitor circuit 504 includes a regulated, stable voltage supply as an input, any variation in the output of the clock jitter monitor circuit is likely due to the jitter in the clock signal at which the output of the delay chain is sampled. For example, during a voltage undershoot situation of the integrated circuit, the supply voltage indication in the output of the digital voltage monitor circuit 502 indicates where along the delay chain the waveform traveled before being latched. However, a simultaneous clock jitter causing clock period compression may cause the supply voltage indication bit in the output to appear even lower in the output, creating a clock-jitter related error in the supply voltage measurements.

To account for this error in the voltage measurement output of the digital voltage monitor circuit 502, the integrated circuit 500 may utilize the output of the clock jitter monitor circuit 504 to adjust the output of the voltage monitor circuit accordingly. In particular, because both circuits 502,504 input the same jittered clock signal and sample on jittered clock signal, the effect of clock jitter on the output of the digital voltage monitor circuit 502 can be determined from the output of the clock jitter monitor circuit 504. In other words, since the voltage supplied to the clock jitter monitor circuit 504 is constant or relatively stable, only the variance in the clock signal may negatively affect when the output of the delay chain is latched.

Simultaneous measurement of the digital voltage monitor circuit 502 and the clock jitter monitor circuit 504 allows for the correction of the digital voltage monitor circuit output by adding or subtracting the clock period jitter deviation obtained through the clock jitter monitor circuit from the output of the digital voltage monitor circuit. For example, an output of the digital voltage monitor circuit 502 may include two asserted bits, indicating that the waveform was latched twice from the delay chain. With no other information, the integrated circuit 500 is unaware of which of the two asserted bits is the accurate measurement due to the circuit voltage. Similarly, the output of the clock jitter monitor circuit 504 may also include two asserted bits, one corresponding to the latching that occurs at the leading edge of the clock signal and one that occurs due to a jitter in the clock signal. Through a comparison of the two outputs, however, the integrated circuit 500 may determine which asserted bit is common between the two outputs and assume that the common asserted bit is the location in the output at which the clock jitter latching occurred. As the two circuits 502,504 are provided different supply voltage signals (the circuit voltage supply for the digital voltage monitor circuit and a regulated voltage supply for the clock jitter monitor circuit), it is likely that the other asserted bits in the outputs would not be in a common location within the bit strings of the outputs. As such, in one embodiment, the identified asserted bit in the output of the digital voltage monitor circuit 502 due to clock jitter may be ignored or discarded by the circuit 500.

In addition, the adjustment to the output of the digital voltage monitor circuit 502 may occur on a cycle-by-cycle basis or over a period of time. For example, each output of the clock jitter monitor circuit 504 as received at each clock cycle may be utilized by the circuit to adjust the digital voltage monitor circuit 502, if needed. In another example, the watermarking feature discussed above may also be utilized for the output of the clock jitter monitor circuit 504. In this example, a high and low value observed by the clock jitter monitor circuit 504 may be stored and applied to the digital voltage monitor circuit 502 output at various times during operation of the circuits. Because the clock jitter is statistically random, long duration peak-to-peak measurement of the clock jitter seen by the clock jitter monitor circuit 504 may be applied to a long duration peak-to-peak voltage measurement. In this manner, the integrated circuit may utilize the output of the clock jitter monitor circuit 504 to adjust the measured voltage of the voltage droop monitor circuit 500 to account for jitters in the sample clock signal.

Figure 6:
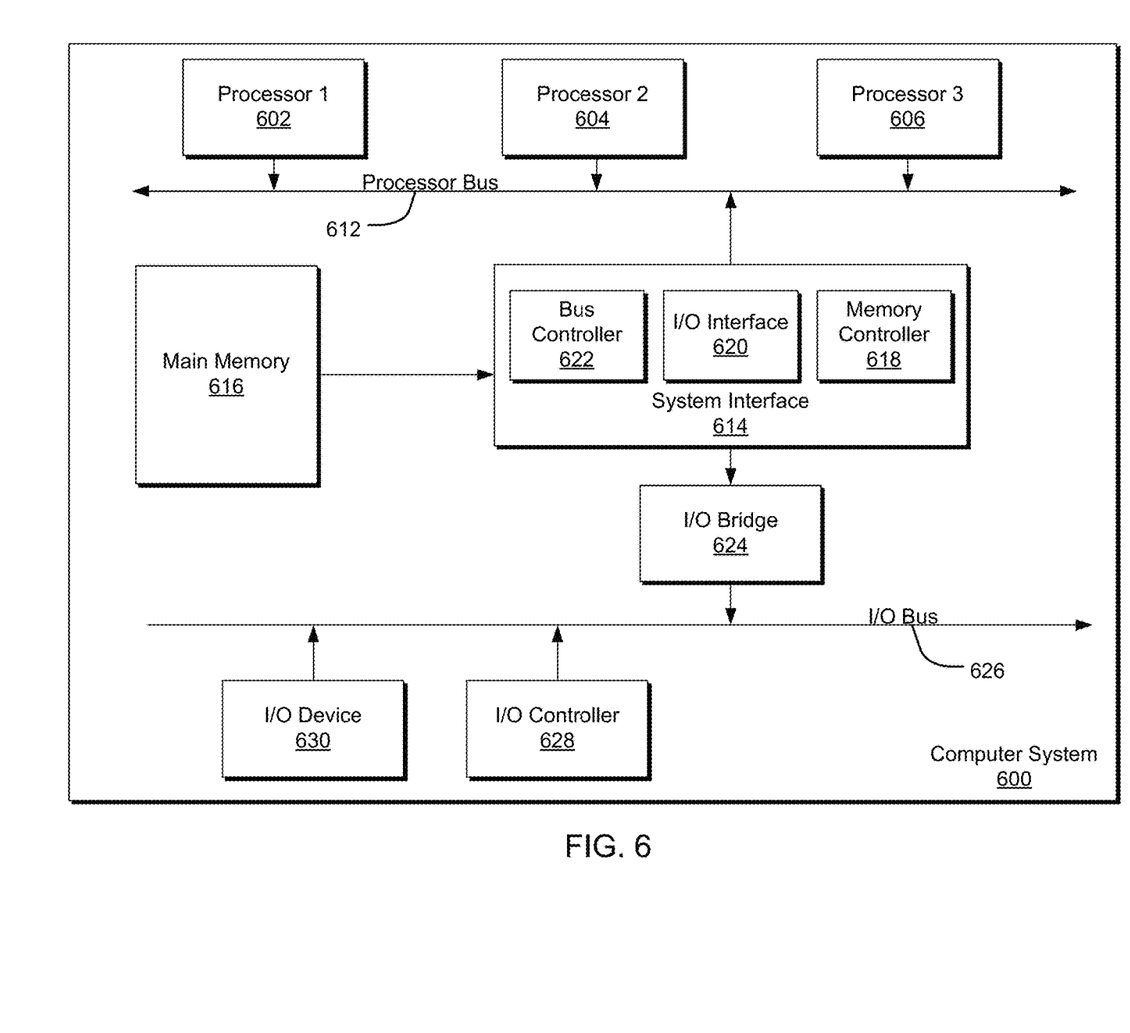
FIG. 6 is a block diagram illustrating an example of a computing system which may be used in implementing embodiments of the present disclosure.

FIG. 6 is a block diagram illustrating an example of a computing device or computer system 600 which may be used in implementing the embodiments of the present disclosure disclosed above. For example, the computing device of FIG. 6 may utilize the digital voltage monitor circuits and/or the clock jitter monitor circuits described above. The computer system (system) includes one or more processors 602-606. Processors 602-606 may include one or more internal levels of cache (not shown) and a bus controller or bus interface unit to direct interaction with the processor bus 612. Processor bus 612, also known as the host bus or the front side bus, may be used to couple the processors 602-606 with the system interface 614. System interface 614 may be connected to the processor bus 612 to interface other components of the system 600 with the processor bus 612. For example, system interface 614 may include a memory controller 618 for interfacing a main memory 616 with the processor bus 612. The main memory 616 typically includes one or more memory cards and a control circuit (not shown). System interface 614 may also include an input/output (I/O) interface 620 to interface one or more I/O bridges or I/O devices with the processor bus 612. One or more I/O controllers and/or I/O devices may be connected with the I/O bus 626, such as I/O controller 628 and I/O device 630, as illustrated.

I/O device 630 may also include an input device (not shown), such as an alphanumeric input device, including alphanumeric and other keys for communicating information and/or command selections to the processors 602-606. Another type of user input device includes cursor control, such as a mouse, a trackball, or cursor direction keys for communicating direction information and command selections to the processors 602-606 and for controlling cursor movement on the display device.

System 600 may include a dynamic storage device, referred to as main memory 616, or a random access memory (RAM) or other computer-readable devices coupled to the processor bus 612 for storing information and instructions to be executed by the processors 602-606. Main memory 616 also may be used for storing temporary variables or other intermediate information during execution of instructions by the processors 602-606. System 600 may include a read only memory (ROM) and/or other static storage device coupled to the processor bus 612 for storing static information and instructions for the processors 602-606. The system set forth in FIG. 6 is but one possible example of a computer system that may employ or be configured in accordance with aspects of the present disclosure.

According to one embodiment, the above techniques may be performed by computer system 600 in response to processor 604 executing one or more sequences of one or more instructions contained in main memory 616. These instructions may be read into main memory 616 from another machine-readable medium, such as a storage device. Execution of the sequences of instructions contained in main memory 616 may cause processors 602-606 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 616. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A digital voltage monitor circuit of an integrated circuit, the digital voltage monitor circuit comprising:
 a voltage monitor portion comprising:
  a delay chain comprising a plurality of inverters powered by a supply voltage of the integrated circuit, wherein a speed of propagation of a signal through each of the plurality of inverters is dependent at least on the supply voltage of the integrated circuit; and
  a plurality of flip-flops each connected to a corresponding inverter in the delay chain, the plurality of flip-flops configured to sample the delay chain on a positive edge of a sample clock signal;
  wherein the delay chain is configured to propagate a system clock signal for the integrated circuit through the plurality of inverters and the plurality of flip-flops is configured to output an N-bit output value corresponding to a power supply voltage measurement of the integrated circuit, wherein N is an integer larger than zero; and
 a coarse delay component in electrical communication with the delay chain, the coarse delay component configured to delay the propagation of the system clock signal through the delay chain for at least two cycles of the system clock signal such that a plurality of system clock signal edges are present in the digital voltage monitor circuit at the same time and only one of the at least two cycles of the system clock signal is sampled on the positive edge of the sample clock signal.

2. The digital voltage monitor circuit of claim 1 wherein the coarse delay component comprises a plurality of a first type of components with a first set of electrical characteristics and the plurality of inverters comprise a plurality of a second type of components with a second set of electrical characteristics different than the first set of characteristics.

3. The digital voltage monitor circuit of claim 2 wherein the first set of electrical characteristics of the first type of components comprises a threshold voltage that is greater than a threshold voltage of the second set of characteristics of the second type of components.

4. The digital voltage monitor circuit of claim 2 wherein the second set of electrical characteristics of the second type of components comprises a transmission rate that is greater than a transmission rate of the first set of characteristics of the first type of components.

5. The digital voltage monitor circuit of claim 1 wherein the sample clock signal comprises the system clock signal.

6. The digital voltage monitor circuit of claim 1 wherein the coarse delay component is programmable by the integrated circuit to select the delay of the propagation of the system clock signal through the delay chain.

7. The digital voltage monitor circuit of claim 1 wherein the delay of the propagation of the system clock signal through the delay chain is between two and three clock cycles of the system clock signal such that at least three system clock signal edges are present in the digital voltage monitor circuit at the same time.

8. The digital voltage monitor circuit of claim 1 wherein the delay chain comprises a first rail of interconnected inverters and a second rail of interconnected inverters, the first and second rails being interconnected through a plurality of cross-couple inverter pairs, wherein the cross-couple inverter pairs feed signals forward in the delay chain.

9. A computer system comprising:
at least one microprocessor;
at least one memory device; and
a digital voltage monitor circuit in communication with the at least one microprocessor, the digital voltage monitor circuit comprising:
  a delay chain comprising a plurality of inverters powered by a supply voltage of the at least one microprocessor, wherein a speed of propagation of a signal through each of the plurality of inverters is dependent at least on the supply voltage of the at least one microprocessor; and
  a plurality of flip-flops each connected to a corresponding inverter in the delay chain, the plurality of flip-flops configured to sample the delay chain on a positive edge of a sample clock signal;
  wherein the delay chain is configured to propagate a system clock signal for the at least one microprocessor through the plurality of inverters and the plurality of flip-flops is configured to output an N-bit output value corresponding to a power supply voltage measurement of the at least one microprocessor, wherein N is an integer larger than zero; and
  a coarse delay component in electrical communication with the delay chain, the coarse delay component configured to delay the propagation of the system clock signal through the delay chain for at least two cycles of the system clock signal such that a plurality of system clock signal edges are present in the digital voltage monitor circuit at the same time and only one of the at least two cycles of the system clock signal is sampled on the positive edge of the sample clock signal.

10. The computer system of claim 9 wherein the coarse delay component comprises a plurality of a first type of components with a first set of electrical characteristics and the plurality of inverters comprise a plurality of a second type of components with a second set of electrical characteristics different than the first set of characteristics.

11. The computer system of claim 10 wherein the first set of electrical characteristics of the first type of components comprises a threshold voltage that is greater than a threshold voltage of the second set of characteristics of the second type of components.

12. The computer system of claim 10 wherein the second set of electrical characteristics of the second type of components comprises a transmission rate that is greater than a transmission rate of the first set of characteristics of the first type of components.

13. The computer system of claim 9 wherein the sample clock signal comprises the system clock signal.

14. The computer system of claim 9 wherein the at least one microprocessor is configured to execute a program stored in the at least one memory device to program the coarse delay component to select the delay of the propagation of the system clock signal through the delay chain.

15. A method for measuring an on-die voltage level in an integrated circuit, the method comprising:
providing at least two cycles of a system clock signal to a digital voltage monitor circuit comprising a plurality of inverters powered by a supply voltage of the integrated circuit, wherein a speed of propagation of a signal through each of the plurality of inverters is dependent at least on the supply voltage of the integrated circuit;
programming a coarse delay component of the digital voltage monitor circuit, the coarse delay component configured to delay propagation of a system clock signal through a delay chain of the digital voltage monitor circuit, the delay comprising at least two cycles of the system clock signal such that a plurality of system clock signal edges are present in the digital voltage monitor circuit at the same time;
latching an output from the plurality of inverters at a plurality of flip-flops each connected to a corresponding inverter in the delay chain, the plurality of flip-flops configured to sample the delay chain on a positive edge of a sample clock signal and output an N-bit output value corresponding to a power supply voltage measurement of the integrated circuit, wherein N is an integer larger than zero;
wherein only one of the at least two cycles of the system clock signal present in the digital voltage monitor circuit is sampled on the positive edge of the sample clock signal.

16. The method of claim 15 wherein the coarse delay component comprises a plurality of a first type of components with a first set of electrical characteristics and the plurality of inverters comprise a plurality of a second type of components with a second set of electrical characteristics different than the first set of characteristics.

17. The method of claim 16 wherein the first set of electrical characteristics of the first type of components comprises a threshold voltage that is greater than a threshold voltage of the second set of characteristics of the second type of components.

18. The method of claim 16 wherein the second set of electrical characteristics of the second type of components comprises a transmission rate that is greater than a transmission rate of the first set of characteristics of the first type of components.

19. The method of claim 15 wherein the sample clock signal comprises the system clock signal.

* * * * *